(12) United States Patent
Duperray

(10) Patent No.: US 8,604,889 B2
(45) Date of Patent: Dec. 10, 2013

(54) TUNABLE LC OSCILLATOR WITH COMMON MODE VOLTAGE ADJUSTMENT

(75) Inventor: David L. Duperray, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/743,177

(22) PCT Filed: Nov. 7, 2008

(86) PCT No.: PCT/IB2008/054670
§ 371 (c)(1),
(2), (4) Date: May 14, 2010

(87) PCT Pub. No.: WO2009/063374
PCT Pub. Date: May 22, 2009

(65) Prior Publication Data
US 2010/0264994 A1 Oct. 21, 2010

Related U.S. Application Data

(60) Provisional application No. 60/988,701, filed on Nov. 16, 2007.

(51) Int. Cl.
*H03B 1/00* (2006.01)
(52) U.S. Cl.
USPC .............. 331/167; 331/117 FE; 331/117 R; 331/177 V
(58) Field of Classification Search
USPC .............. 331/167, 177 V, 117 R, 117 FE, 34
See application file for complete search history.

(56) References Cited

U.S. PATENT DOCUMENTS

| 6,765,448 B2* | 7/2004 | Wu et al. ................. 331/117 FE |
| 6,906,596 B2* | 6/2005 | Kitamura et al. ........... 331/36 C |
| 2004/0085144 A1 | 5/2004 | Wu et al. |
| 2008/0100350 A1 | 5/2008 | Pernia et al. |

FOREIGN PATENT DOCUMENTS

| EP | 1 333 574 A | 8/2003 |
| GB | 2 349 995 A | 11/2000 |

OTHER PUBLICATIONS

Rogers, John W. M., et al; "A Study of Digitial and Analog Automatic-Amplitude Control Circuitry for Voltage-Controlled Oscillators"; IEEE Journal of Solid-State Circuits, IEEE Service Center, Piscataway, NJ, US; Vol. 38, No. 2 (Feb. 1, 2003).
Manetakis, Kostas, et al; "A CMOS VCO With 48% Tuning Range for Modern Broadband Systems"; IEEE 2004 Custom Integrated Circuits Conference; p. 265-268 (2004).

* cited by examiner

*Primary Examiner* — Arnold Kinkead

(57) ABSTRACT

An LC oscillator is provided that achieves improved phase noise performance. A variable frequency oscillator includes a variable supply source, an oscillator tank circuit, a variable capacitance circuit comprising MOS switches, and an oscillator tank voltage common mode adjustment circuit. When the capacitance of the variable capacitance circuit is varied to vary an output frequency of the variable frequency oscillator, the common mode voltage is adjusted to reduce transitions of the MOS switches between an inversion state and a depletion state during excursions of an output signal through one cycle of oscillation.

19 Claims, 3 Drawing Sheets

TUNABLE LC OSCILLATOR WITH COMMON MODE VOLTAGE ADJUSTMENT

A typical wireless transceiver uses at least one high frequency oscillator to generate a modulated carrier when transmitting or to down-convert an incoming modulated signal when receiving.

For many wireless standards (like GSM, WCDMA, Bluetooth, WLAN, etc.), the type of oscillator used in the radio transceiver is the LC-type oscillator. For cost reasons, CMOS has become the preferred process used in designing wireless transceivers. Using LC oscillators enables phase noise to be achieved that is acceptable for many cellular, WPAN and WLAN systems. However, deterioration in phase noise performance may often be observed with variations in output power.

An LC oscillator is provided that achieves improved phase noise performance. A variable frequency oscillator includes a variable supply source, an oscillator tank circuit, a variable capacitance circuit comprising MOS switches, and an oscillator tank voltage common mode adjustment circuit. When the capacitance of the variable capacitance circuit is varied to vary an output frequency of the variable frequency oscillator, the common mode voltage is adjusted to reduce transitions of the MOS switches between an inversion state and a depletion state during excursions of an output signal through one cycle of oscillation.

Other features and advantages will be understood upon reading and understanding the detailed description of exemplary embodiments, found herein below, in conjunction with reference to the drawings, a brief description of which is provided below.

Figure 1:
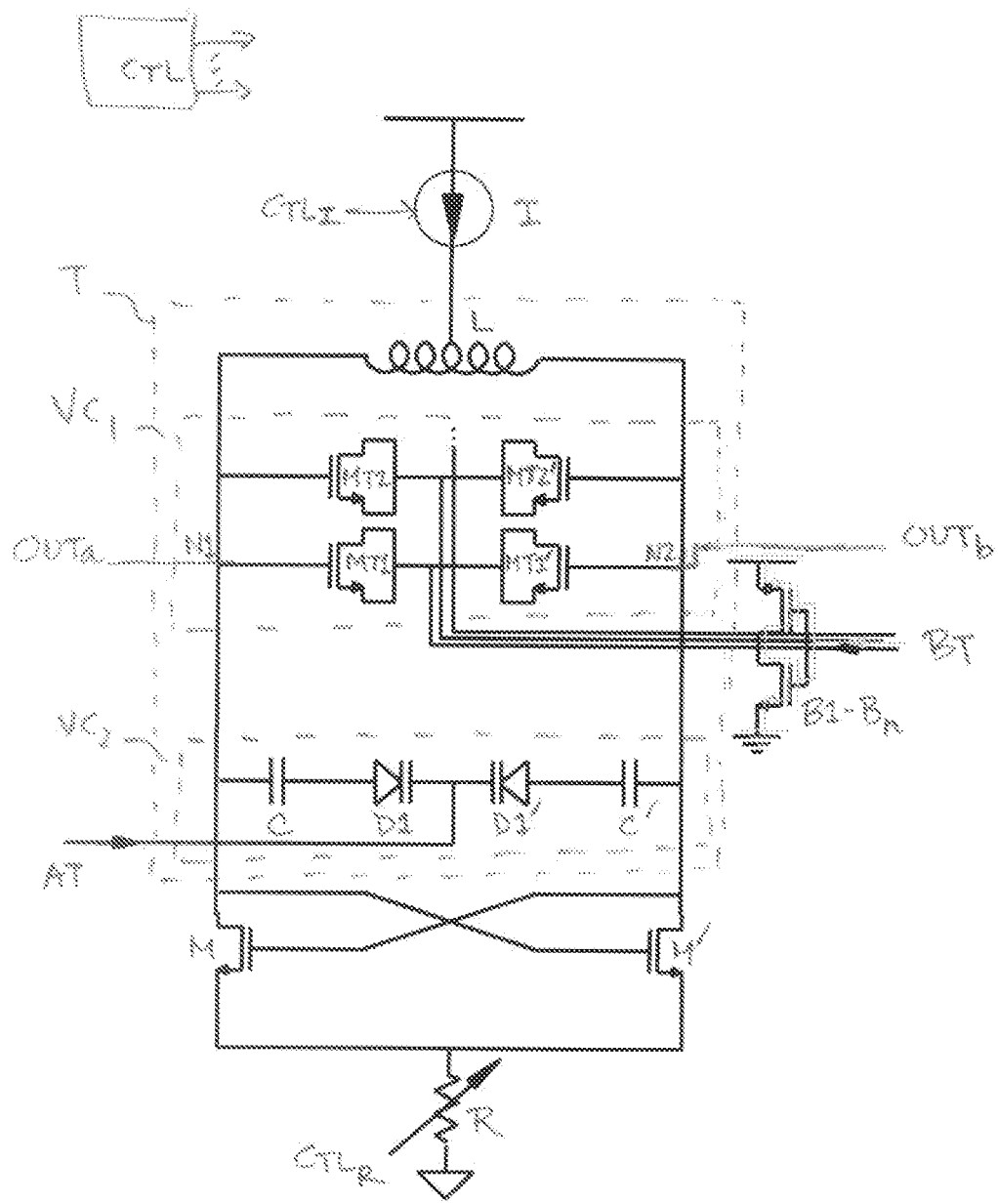
Figure 2:
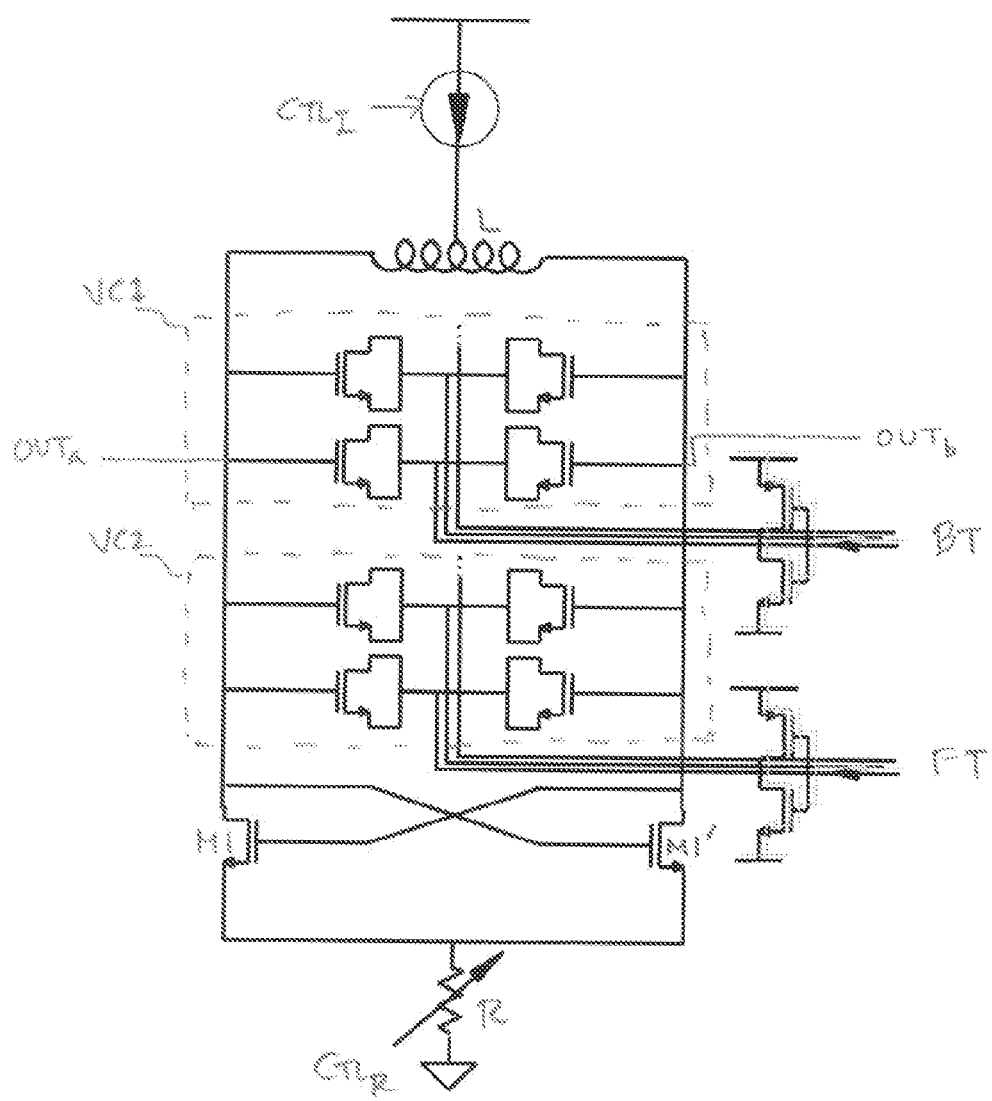
Figure 3:
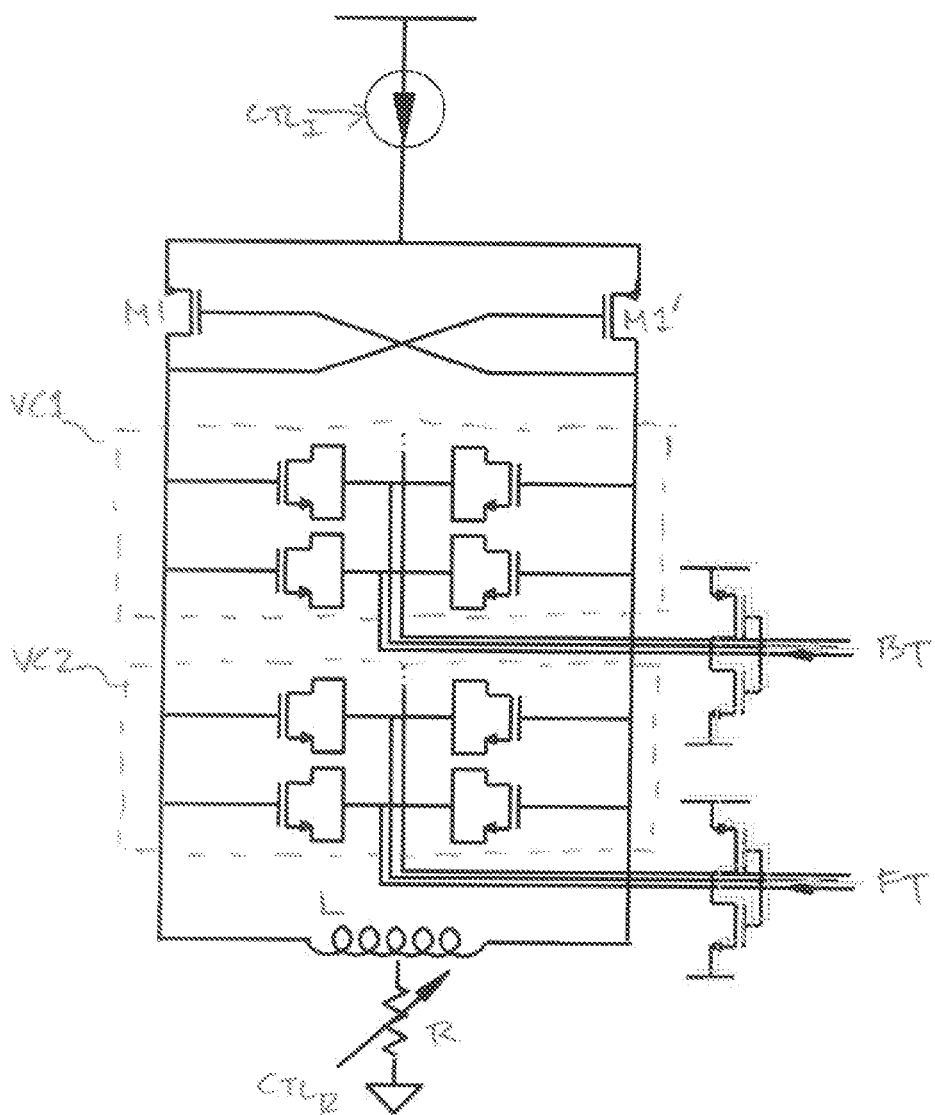

FIG. 1 is a diagram of a first LC oscillator.
FIG. 2 is a diagram of another LC oscillator.
FIG. 3 is a diagram of another LC oscillator.

There follows a more detailed description of the present invention. Those skilled in the art will realize that the following detailed description is illustrative only and is not intended to be in any way limiting. Other embodiments of the present invention will readily suggest themselves to such skilled persons having the benefit of this disclosure. Reference will now be made in detail to embodiments of the present invention as illustrated in the accompanying drawings. The same reference indicators will be used throughout the drawings and the following detailed description to refer to the same or like parts.

Referring now to FIG. 1, a diagram is shown of an LC oscillator having improved phase noise performance. A regulated current source I is coupled to a supply voltage Vdd and provides the necessary current to the oscillator to create oscillation conditions and guarantee sufficient oscillation amplitude. The regulated current is set using a control signal $CTL_I$. The regulated current source is coupled to an inductor L, shown in FIG. 1 as a center-tapped inductor. Coupled in parallel with the inductor L are a first variable capacitance circuit VC1 and a second variable capacitance circuit VC2. The inductor L, the first variable capacitance circuit VC1 and the second variable capacitance circuit VC2 together form a resonant tank circuit T. The first variable capacitance circuit VC1, may be based on MOS transistors controlled as switches and may be used to control coarsely the oscillator frequency to perform band tuning.

More particularly, in the first variable capacitance circuit, n pairs of MOS transistors are provided, MT1, MT1', MT2, MT2', . . . , MTn, MTn'. All of the MOS transistors have their drain and source electrodes connected together. Gate electrodes of MT1, MT2, . . . , MTn are connected to a circuit node N1 on one side of the tank circuit T. Gate electrodes of MT1', MT2', . . . , MTn' are connected to a circuit node N2 on an opposite side of the tank circuit T. Paired ones of the MOS transistors have their drain and source electrode connected together and connected to a control signal produced by a respective one of n buffer circuits B1-Bn. Responsive to a digital control word BT, the buffer circuits switch in or switch out the MOS transistor pairs to vary the capacitance of the variable capacitance circuit VC1.

The second variable capacitance circuit VC2 may be an analog tuning circuit used to precisely control the oscillator frequency. In the illustrated embodiment, a varactor diode D1 is AC coupled by a capacitor C to node N1 of the oscillator tank, and a varactor diode D1' is AC coupled by a capacitor C' to node N2 of the oscillator tank. Control electrodes of the junction varicaps D1 and D1' are connected together and connected to an analog tuning signal AT.

A cross-coupled transistor pair M, M' is used to drive the tank and maintain oscillation. Output signals OUTa and OUTb are taken at nodes N1 and N2, respectively.

Oscillator tank voltage common mode adjustment is provided using a variable resistor R. The resistance of the variable resistor R is set using a control signal $CTL_R$. Using the variable resistor R, the tank common mode voltage can be controlled for a defined (regulated) current. By doing so the common mode voltage can be optimally adjusted such that the MOS tuning switches MT1-MTn and MT1'-MTn' in the oscillator tank do not change state (from inversion to depletion or vice versa) due to the oscillation amplitude. By keeping the MOS switches in one state (inversion or depletion), insensitive to oscillation amplitude, the phase noise of the oscillator is not degraded (due to inversion/depletion changes in the MOS switches) and therefore the oscillator phase noise is minimized.

In other words, the common mode voltage is adapted depending on frequency to minimize AM to FM conversion in the bandswitch VC1. For low frequencies, most of the MOS transistors are in inversion, therefore the common mode voltage is increased. For high frequencies, most of the MOS transistors are in depletion, therefore the common mode voltage is decreased. Particular desired settings for the common mode voltage for different frequencies may be obtained empirically or by simulation and stored in a look-up table used to control the common mode voltage. In an exemplary embodiment, the following values were obtained:

TABLE 1

| Freq (GHz) | 8.8 | 9.4 | 9.7 | 10.5 | 11.3 |
|---|---|---|---|---|---|
| Vtank_cm (V) | 2 | 1.8 | 1.6 | 1.3 | 0.8 |

A control circuit CTL provides control signals BT, AT, $CTL_I$ and $CTL_R$.

Referring to FIG. 2, another embodiment of an LC oscillator is shown. In this embodiment, the variable capacitance circuit VC2 used to perform fine tuning is constructed in a similar manner as the variable capacitance circuit VC1, using MOS switches. It is controlled using a digital word FT.

Referring to FIG. 3, another embodiment of an LC oscillator is shown. In this embodiment, PMOS transistors are used for the cross-coupled transistor pair M1, M1'.

Although embodiments of the present invention have been described in detail, it should be understood that various changes, substitutions and alternations can be made without departing from the spirit and scope of the inventions as defined by the appended claims.

What is claimed is:

1. An adjustable frequency oscillator comprising:
a variable supply source;
a tank circuit coupled to the variable supply source and comprising:
an inductance; and
a first variable capacitance circuit comprising MOS switches configured to change a frequency of the adjustable frequency oscillator;
a cross-coupled transistor pair coupled to the tank circuit;
a common mode voltage adjustment circuit coupled to the cross-coupled transistor pair and to a reference voltage; and
a control circuit configured to, when the frequency is changed, adjust the common mode voltage to reduce state changes of the MOS switches, wherein the common mode voltage increases when the frequency is reduced, and decreases when the frequency is increased.

2. The apparatus of claim 1, wherein the common mode voltage is adjusted to reduce transitions of the MOS switches between an inversion state and a depletion state during excursions of an output signal through one cycle of oscillation.

3. The apparatus of claim 2, wherein the cross-coupled transistor pair comprises:
a first MOS transistor defining a first current path; and
a second MOS transistor defining a second current path, wherein source electrodes of the first MOS transistor and the second MOS transistor are coupled to the reference voltage, a gate electrode of the first MOS transistor is coupled to a drain electrode of the second MOS transistor, and a gate electrode of the second MOS transistor is coupled to a drain electrode of the first MOS transistor.

4. The apparatus of claim 3, wherein the first MOS transistor and the second MOS transistor are both NMOS transistors.

5. The apparatus of claim 3, wherein the first MOS transistor and the second MOS transistor are both PMOS transistors.

6. The apparatus of claim 3, wherein the variable supply source is a regulated current source.

7. The apparatus of claim 3, wherein the first variable capacitance circuit comprises:
a pair of MOS transistors, wherein drain and source electrodes of both transistors of the pair of MOS transistors are coupled to a control node, a gate electrode of one transistor of the pair of MOS transistors is coupled to the first current path, and a gate electrode of another transistor of the pair of MOS transistors is coupled to the second current path.

8. The apparatus of claim 7, comprising:
a buffer circuit that receives a digital control signal and in response thereto drives the control node to control a capacitance of the first variable capacitance circuit.

9. The apparatus of claim 7, wherein the first variable capacitance circuit comprises:
a plurality of pairs of MOS transistors, drain and source electrodes of both transistors of each pair of MOS transistors are coupled to a respective control node of a plurality of control nodes, a gate electrode of one transistor of each pair of MOS transistors is coupled to the first current path, and a gate electrode of another transistor of each pair of MOS transistors is coupled to the second current path.

10. The apparatus of claim 7, comprising:
a plurality of buffer circuits, each of which receives a digital control signal and in response thereto drives a respective one of the control nodes to control a capacitance of the first variable capacitance circuit.

11. The apparatus of claim 10, wherein the first variable capacitance circuit is configured to achieve coarse frequency control of the adjustable frequency oscillator.

12. The apparatus of claim 3, comprising:
a second variable capacitance circuit comprising a pair of MOS transistors, wherein drain and source electrodes of both transistors of the pair of MOS transistors are coupled to a control node, a gate electrode of one transistor of the pair of MOS transistors is coupled to the first current path, and a gate electrode of another transistor of the pair of MOS transistors is coupled to the second current path.

13. The apparatus of claim 12, comprising:
a buffer circuit that receives a digital control signal and in response thereto drives the control node to control a capacitance of the second variable capacitance circuit.

14. The apparatus of claim 12, wherein the second variable capacitance circuit comprises:
a plurality of pairs of MOS transistors, drain and source electrodes of both transistors of each pair of MOS transistors are coupled to a respective control node of a plurality of control nodes, a gate electrode of one transistor of each pair of MOS transistors is coupled to the first current path, and a gate electrode of another transistor of each pair of MOS transistors is coupled to the second current path.

15. The apparatus of claim 14, comprising:
a plurality of buffer circuits, each of which receives a digital control signal and in response thereto drives a respective one of the control nodes to control a capacitance of the second variable capacitance circuit.

16. The apparatus of claim 15, wherein the second variable capacitance circuit is configured to achieve fine frequency control of the adjustable frequency oscillator.

17. The apparatus of claim 3, further comprising:
a pair of varactor diodes, cathode electrodes of both varactor diodes of the pair of varactor diodes are coupled to a control node, an anode electrode of one varactor diode of the pair of varactor diodes is coupled to the first current path, and an anode electrode of another varactor diode of the pair of varactor diodes is coupled to the second current path.

18. The apparatus of claim 15, wherein the second variable capacitance circuit has an analog tuning signal applied thereto and is configured to achieve fine frequency control of the adjustable frequency oscillator.

19. A method of controlling a variable frequency oscillator having a supply source, an oscillator tank, and a variable capacitance circuit comprising MOS switches controlled to change a frequency of the variable frequency oscillator, and an adjustment circuit configured to adjust a common mode voltage of the oscillator tank, the method comprising:
changing the frequency of the variable frequency oscillator; and
adjusting the common mode voltage so as to reduce transitions of the MOS switches between an inversion state and a depletion state during excursions of an output signal through one cycle of oscillation, wherein the common mode voltage increases when the frequency is reduced, and decreases when the frequency is increased.

* * * * *